US009818774B2

(12) United States Patent
Jin et al.

(10) Patent No.: US 9,818,774 B2
(45) Date of Patent: Nov. 14, 2017

(54) FABRICATION METHOD OF PIXEL STRUCTURE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Xiaotao Jin, Beijing (CN); Zelin Chen, Beijing (CN); Fei Ou, Beijing (CN); Xiaofeng Yang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/913,475

(22) PCT Filed: Aug. 10, 2015

(86) PCT No.: PCT/CN2015/086497
§ 371 (c)(1),
(2) Date: Feb. 22, 2016

(87) PCT Pub. No.: WO2016/138741
PCT Pub. Date: Sep. 9, 2016

(65) Prior Publication Data
US 2016/0380010 A1 Dec. 29, 2016

(30) Foreign Application Priority Data

Mar. 2, 2015 (CN) .......................... 2015 1 0093438

(51) Int. Cl.
*H01L 27/12* (2006.01)
*H01L 21/3065* (2006.01)
*H01L 29/66* (2006.01)

(52) U.S. Cl.
CPC ...... *H01L 27/1288* (2013.01); *H01L 21/3065* (2013.01); *H01L 27/124* (2013.01); *H01L 27/127* (2013.01); *H01L 29/66765* (2013.01)

(58) Field of Classification Search
CPC H01L 27/1288; H01L 21/3065; H01L 27/127
See application file for complete search history.

(56) References Cited

U.S. PATENT DOCUMENTS 5,902,452 A 5/1999 Cheng et al.
2003/0186478 A1* 10/2003 Morita ............... H01L 27/1214
438/30

(Continued)

FOREIGN PATENT DOCUMENTS

CN 101211784 A 7/2008
CN 103367166 A 10/2013

(Continued)

OTHER PUBLICATIONS

First Chinese Office Action dated Dec. 1, 2016; Appln. No. 201510093438.3.

(Continued)

*Primary Examiner* — Karen Kusumakar
(74) *Attorney, Agent, or Firm* — Ladas & Parry LLP

(57) ABSTRACT

A fabrication method of a pixel structure is provided. The fabrication method includes: forming a gate electrode, a gate insulating layer, an active layer, a pixel electrode layer and a source-drain electrode layer on a substrate, and etching the source-drain electrode layer by using a photoresist pattern to form a source electrode and a drain electrode; ashing the photoresist pattern, so as to align edges of the ashed pho- (Continued)

toresist pattern with edges of the source electrode and the drain electrode; etching a silicon oxide generated in ashing the photoresist pattern; and etching a semiconductor layer between the source electrode and the drain electrode by an etching process to form a channel. The fabrication method can remove indium-containing material remained on both sides of a source electrode and a drain electrode, and can resolve a problem that a width of a channel between the source electrode and the drain electrode is small.

10 Claims, 4 Drawing Sheets

(56) References Cited

U.S. PATENT DOCUMENTS

2004/0266047 A1* 12/2004 Kim ................ G02F 1/1368
  438/48
2010/0075450 A1* 3/2010 Choi ................ G02F 1/1368
  438/30

FOREIGN PATENT DOCUMENTS

KR  1020020080857   *  4/2001
KR  1020020080857 A  10/2002

OTHER PUBLICATIONS

The Second Chinese Office Action dated Jul. 3, 2017; Appln. No. 201510093438.3.

* cited by examiner

FABRICATION METHOD OF PIXEL STRUCTURE

TECHNICAL FIELD

An embodiment of the present disclosure relates to a fabrication method of a pixel structure.

BACKGROUND

With rapid development of a display device such as a Thin Film Transistor-Liquid Crystal Display (TFT-LCD), requirements on various performances of the TFT-LCD are getting higher and higher. At present, as shown in FIG. 1, a gate electrode 12, a gate insulating layer 13, a semiconductor layer 17, an Indium Tin Oxide (ITO) layer 14 and a source-drain electrode layer are sequentially formed on a glass substrate 11, and the source-drain electrode layer is etched by using a photoresist pattern 18 by an etching process to form a source electrode 16 and a drain electrode 15, wherein, at this moment, the source electrode 16 and the drain electrode 15 are structures after the source-drain electrode layer is etched by using the photoresist pattern 18.

As shown in FIG. 2, next, when the semiconductor layer 17 is etched by using the photoresist pattern 18 to form a channel 19, due to blocking of an outer edge of the photoresist pattern 18, when plasma bombards the ITO, a part of indium-containing material 20 is remained on both sides of the source electrode 16 and the drain electrode 15, resulting in poor quality of the TFT-LCD; moreover, due to blocking of an inner edge of the photoresist pattern 18, a width of the channel 19 formed by etching the semiconductor layer 17 is less than a distance between the source electrode 16 and the drain electrode 15, that is, there is a semiconductor step, resulting in high leakage current.

SUMMARY

An embodiment of the present disclosure is to provide a fabrication method of a pixel structure, which can remove indium-containing material remained on both sides of a source electrode and a drain electrode, and can resolve a problem that a width of a channel between the source electrode and the drain electrode is small.

In one aspect, an embodiment of the present disclosure provides a fabrication method of a pixel structure, and the fabrication method comprises: forming a gate electrode, a gate insulating layer, an active layer, a pixel electrode layer and a source-drain electrode layer on a substrate, and etching the source-drain electrode layer by using a photoresist pattern to form a source electrode and a drain electrode; ashing the photoresist pattern, so as to align edges of the ashed photoresist pattern with edges of the source electrode and the drain electrode; etching a silicon oxide generated when ashing the photoresist pattern; and etching a semiconductor layer between the source electrode and the drain electrode by an etching process to form a channel.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the present disclosure provides a fabrication method of a pixel structure, which can resolve problems that indium-containing material is remained on both sides of a source electrode and a drain electrode, and a width of a channel between the source electrode and the drain electrode is small.

The fabrication method comprises:

301: forming a gate electrode, a gate insulating layer, an active layer, a pixel electrode layer and a source-drain electrode layer on a substrate (e.g., a glass substrate, a quartz substrate and so on), and etching the source-drain electrode layer by using a photoresist pattern formed by a source-drain electrode mask to form a source electrode and a drain electrode.

302: ashing the photoresist pattern, so as to align edges of the ashed photoresist pattern with edges of the source electrode and the drain electrode.

Figure 1:
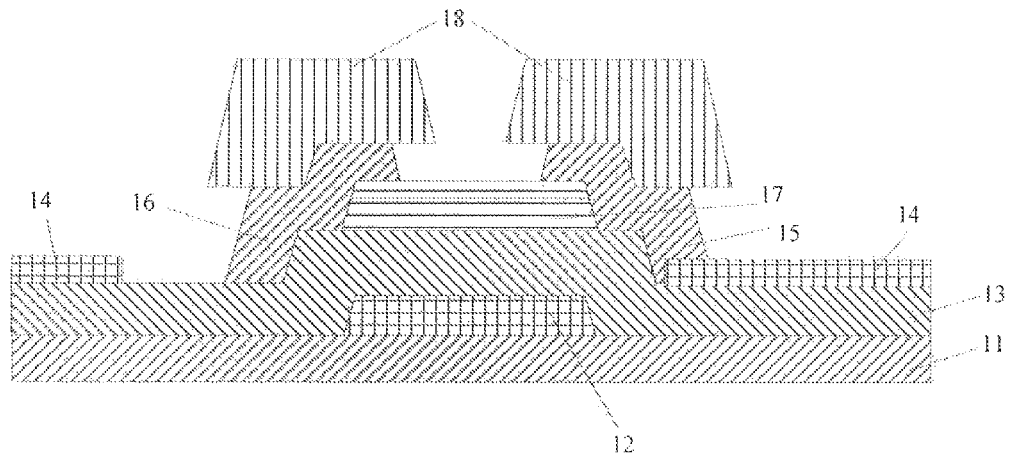
FIG. 1 is a structural sectional diagram when forming a pixel structure in the prior art.
Figure 2:
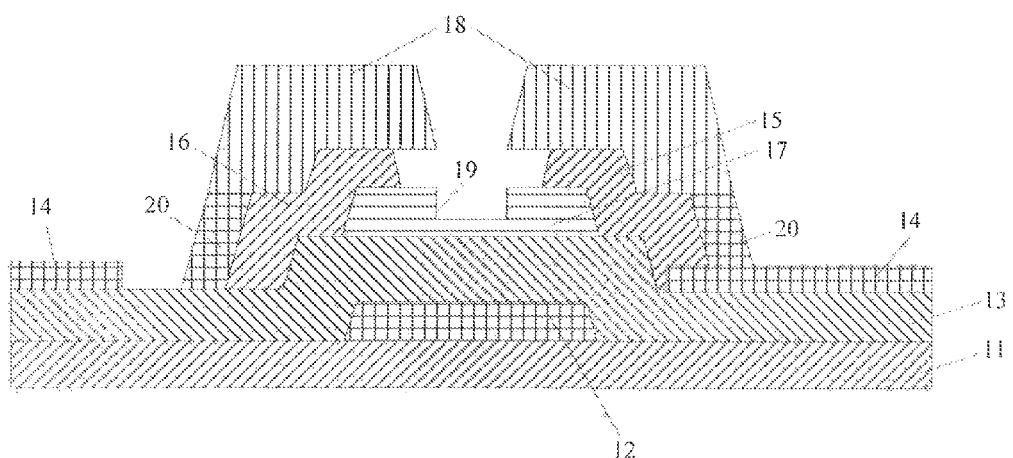
FIG. 2 is a structural sectional diagram of a structure of FIG. 1 after forming a channel.
Figure 3:
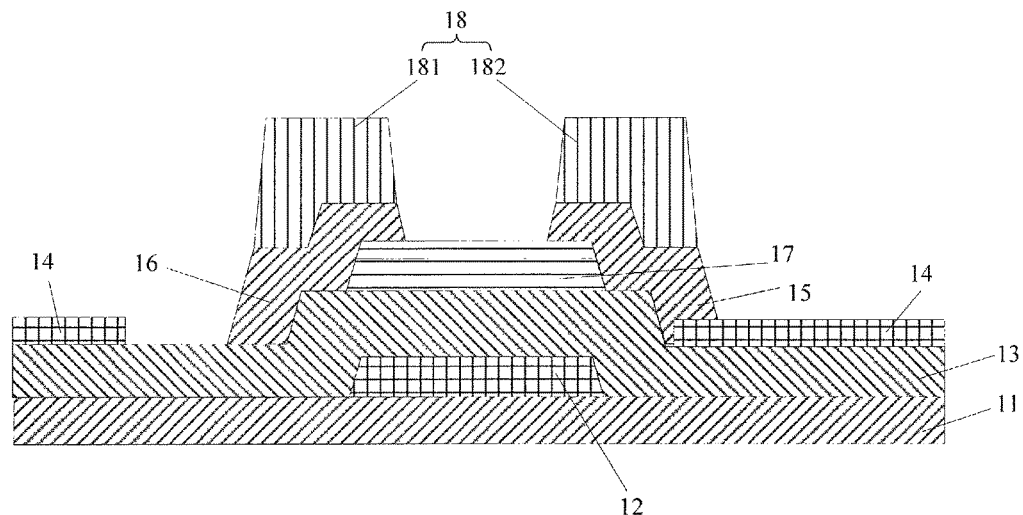
FIG. 3 is a sectional diagram of the structure of FIG. 1 after ashing a photoresist pattern.

Optionally, as shown in FIG. 3, the photoresist pattern 18 includes a first photoresist pattern 181 and a second photoresist pattern 182 which are independent of each other, wherein, a width of the ashed first photoresist pattern 181 is same as that of the source electrode 16, so as to align a structure of the ashed first photoresist pattern 181 with edges of the source electrode 16; and a width of the ashed second photoresist pattern 182 is same as that of the drain electrode 15, so as to align a structure of the ashed second photoresist pattern 182 with edges of the drain electrode 15.

Figure 4:
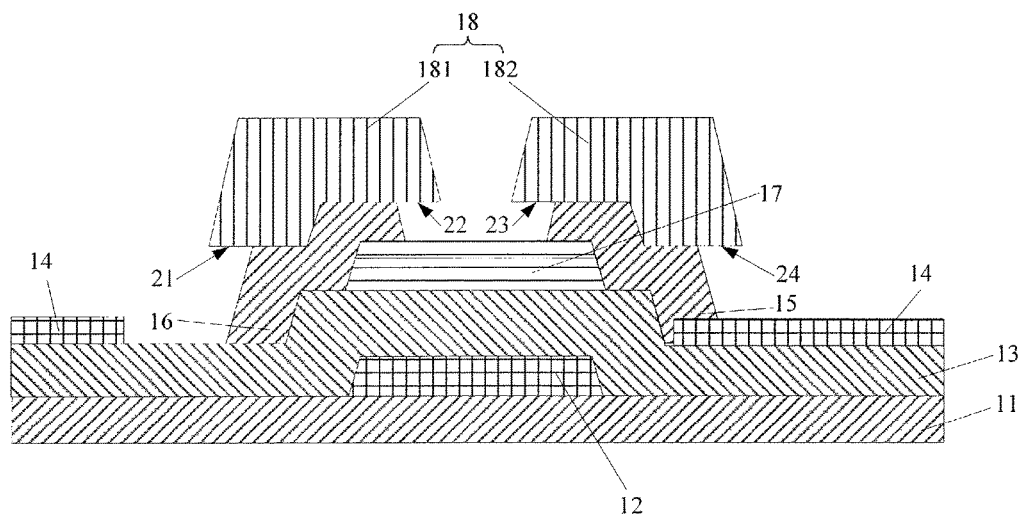
FIG. 4 is a cross-sectional diagram of the structure of FIG. 3 before ashing a photoresist pattern.

Optionally, a time for ashing the first photoresist pattern 181 is determined according to an area of a non-overlapping region between the first photoresist pattern 181 and the source electrode 16, and a time for ashing the second photoresist pattern 182 is determined by an area of a non-overlapping region between the second photoresist pattern 182 and the drain electrode 15. As shown in FIG. 4, the non-overlapping region between the first photoresist pattern 181 and the source electrode 16 includes a first non-overlapping region 21 and a second non-overlapping region 22, and the non-overlapping region between the second photoresist pattern 182 and the drain electrode 15 includes a third non-overlapping region 23 and a fourth non-overlapping region 24.

Exemplarily, a gas for ashing the photoresist pattern 18 is $O_2$, or a mixed gas of $O_2$ and $SF_6$, a source radio frequency power is 1000 W-3000 W, a biased radio frequency power is 500 W-1500 W, and a pressure is 100-300 mtorr.

303: etching a silicon oxide generated when ashing the photoresist pattern.

Figure 5:
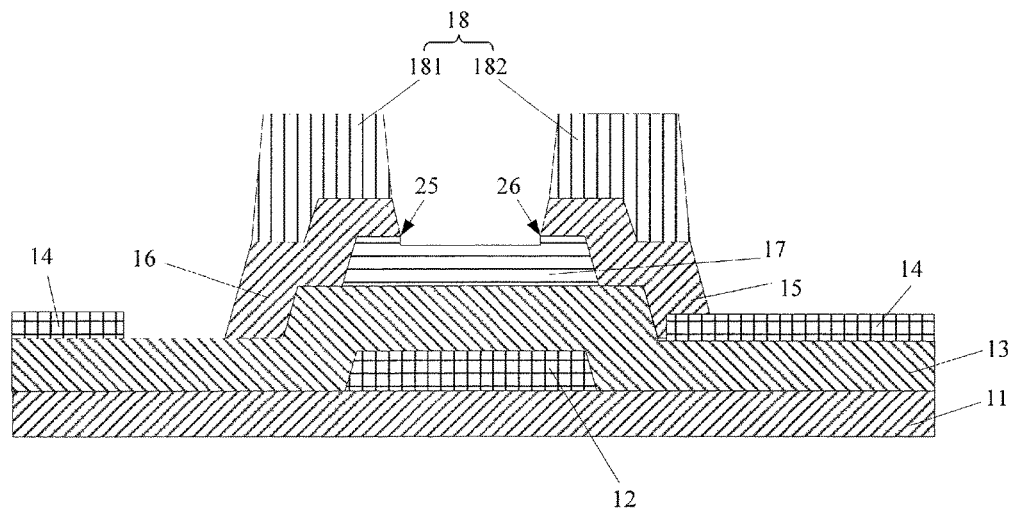
FIG. 5 is a cross-sectional diagram of the structure of FIG. 4 after etching a silicon oxide.

Optionally, as shown in FIG. 5, a width etched of the silicon oxide is equal to a distance between the source electrode 16 and the drain electrode 15, so as to align edges of a structure of the etched silicon oxide with a source electrode lower edge 25 of the source electrode 16 with respect to the drain electrode 15 and a drain electrode lower edge 26 of the drain electrode 15 with respect to the source electrode 16, respectively.

Wherein, the silicon oxide is generated by oxidizing the semiconductor layer 17 with a gas generated when ashing the photoresist pattern 18.

Exemplarily, for etching the silicon oxide, a source radio frequency power is 2000 W-4000 W, a biased radio frequency power is 2000 W-4000 W, and a pressure is 10-100 mtorr. In the embodiment of the present disclosure, since the silicon oxide material is stable, it is necessary to be etched by high energy, and a relatively high radio frequency power is selected in the etching process.

304: etching a semiconductor layer 17 between the source electrode and the drain electrode by an etching process.

Exemplarily, the etching process may be a dry-etching process.

Figure 6:
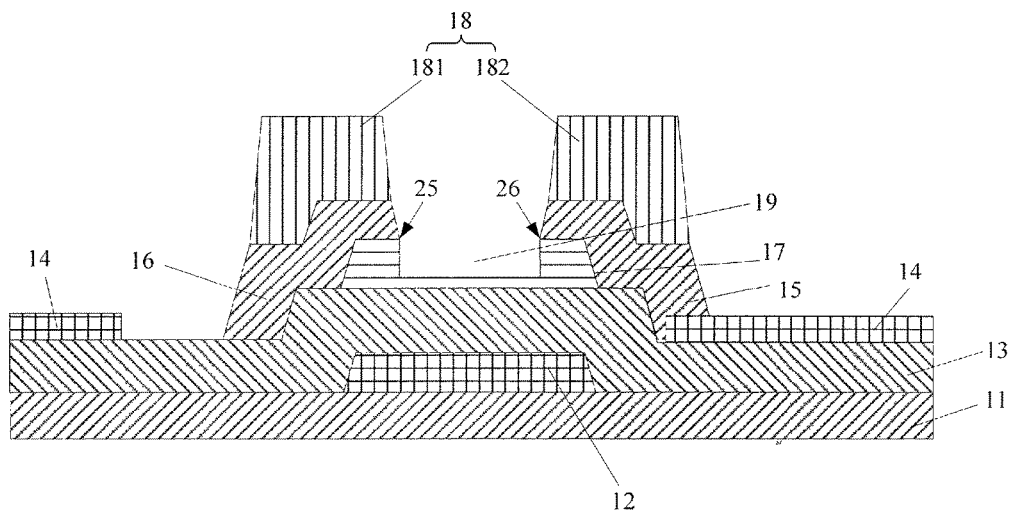
FIG. 6 is a cross-sectional diagram of the structure of FIG. 5 after etching a semiconductor layer.

Optionally, as shown in FIG. 6, a width etched of the semiconductor layer 17 is equal to a distance between the source electrode 16 and the drain electrode 15, so as to align edges of a structure of the etched semiconductor layer 17 with the source electrode lower edge 25 of the source electrode 16 with respect to the drain electrode 15 and the drain electrode lower edge 26 of the drain electrode 15 with respect to the source electrode 16, respectively, wherein a width etched of the semiconductor layer 17 is equal to that of the channel 19.

Exemplarily, a gas for etching the semiconductor layer between the source electrode and the drain electrode is a mixed gas of He, $Cl_2$ and $SF_6$, a source radio frequency power is 200 W-1000 W, a biased radio frequency power is 200 W-1000 W, and a pressure is 10-100 mtorr. In the embodiment of the present disclosure, in order to ensure that the channel have an even and flat surface, it is necessary to ensure a relatively low etching speed for etching the channel, so relatively low radio frequency energy is selected for etching the channel.

Figure 7:
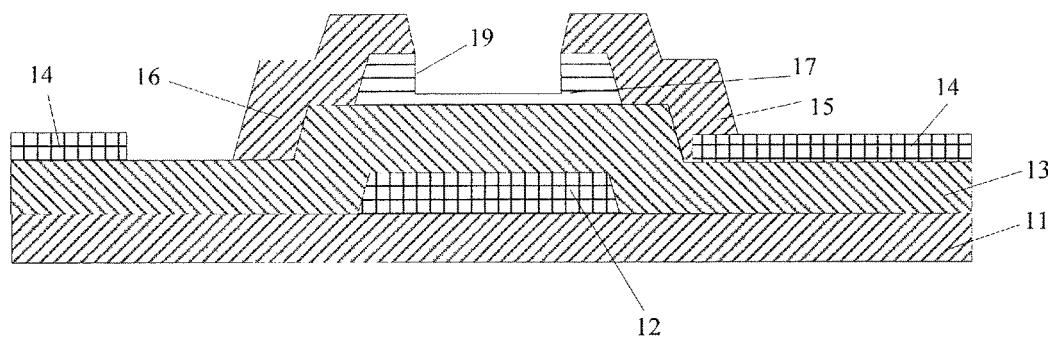
FIG. 7 is a cross-sectional diagram of the structure of FIG. 6 after removing the photoresist.

Optionally, after step 304, the method further comprises: removing the photoresist pattern covering the source electrode and the drain electrode. As shown in FIG. 7, there is a cross-sectional diagram after removing the photoresist pattern 18.

In the fabrication method of the pixel structure provided by an embodiment of the present disclosure, by ashing both sides of the photoresist pattern, it can be realized that a width of the ashed photoresist pattern is equal to that of the source electrode or the drain electrode, so as to prevent a part of indium-containing material from remaining on both sides of the source electrode and the drain electrode when plasma bombards the ITO layer, further improving quality of the TFT-LCD; and a width of the channel formed by etching is equal to a distance between the source electrode and the drain electrode, so as to avoid a semiconductor step, further reducing the leakage current.

The fabrication method of the pixel structure provided by an embodiment of the present disclosure, may be applicable to etching a semiconductor layer to form a channel, but is not limited thereto.

In descriptions of the implementation modes, specific features, structures, materials or characteristics may be combined in an applicable way in any one or more embodiments or examples.

The foregoing are only specific embodiments of the present disclosure, but the protection scope of the present disclosure is not limited thereto. In the technical scope disclosed by the present disclosure, changes or substitutions easily thought by any skilled in the art are all covered in the protection scope of the present disclosure. Therefore, the protection scope of the present disclosure should be the protection scope of the claims.

The present application claims priority of Chinese Patent Application No. 201510093438.3 filed on Mar. 2, 2015, the disclosure of which is incorporated herein by reference in its entirety as part of the present application.

The invention claimed is:

1. A fabrication method of a pixel structure, comprising:
   forming a gate electrode, a gate insulating layer, an active layer, a pixel electrode layer and a source-drain electrode layer on a substrate, and etching the source-drain electrode layer by using a photoresist pattern to form a source electrode and a drain electrode;
   ashing both sides of the photoresist pattern, and removing indium-containing material remained on both sides of the source electrode and the drain electrode, so as to align edges of the ashed photoresist pattern with edges of the source electrode and the drain electrode;
   etching a silicon oxide generated when ashing the photoresist pattern; and
   etching a semiconductor layer between the source electrode and the drain electrode by a dry etching process to form a channel, wherein a width etched of the semiconductor layer is equal to a distance between the source electrode and the drain electrode.

2. The fabrication method of the pixel structure according to claim 1, wherein the photoresist pattern includes a first photoresist pattern and a second photoresist pattern which are independent of each other, wherein a width of the ashed first photoresist pattern is same as that of the source electrode, so as to align edges of a structure of the ashed first photoresist pattern with edges of the source electrode; and a width of the ashed second photoresist pattern is same as that of the drain electrode, so as to align edges of a structure of the ashed second photoresist pattern with edges of the drain electrode.

3. The fabrication method of the pixel structure according to claim 2, wherein a time for ashing the first photoresist pattern is determined according to an area of a non-overlapping region between the first photoresist pattern and the source electrode, and a time for ashing the second photoresist pattern is determined according to an area of a non-overlapping region between the second photoresist pattern and the drain electrode.

4. The fabrication method of the pixel structure according to claim 1, wherein a gas for ashing the photoresist pattern is $O_2$, or a mixed gas of $O_2$ and $SF_6$, a source radio frequency power is 1000 W-3000 W, a biased radio frequency power is 500 W-1500 W, and a pressure is 100-300 mtorr.

5. The fabrication method of the pixel structure according to claim 1, wherein the silicon oxide is generated by oxidizing the semiconductor layer with a gas generated in ashing the photoresist pattern.

6. The fabrication method of the pixel structure according to claim 1, wherein, for etching the silicon oxide, a source radio frequency power is 2000 W-4000 W, a biased radio frequency power is 2000 W-4000 W, and a pressure is 10-100 mtorr.

7. The fabrication method of the pixel structure according to claim 1, wherein a width of the silicon oxide etched is equal to a distance between the source electrode and the drain electrode, so as to align edges of a structure of the etched silicon oxide with a lower edge of the source electrode with respect to the drain electrode and a lower edge of the drain electrode with respect to the source electrode, respectively.

8. The fabrication method of the pixel structure according to claim 1, wherein a gas for etching the semiconductor layer between the source electrode and the drain electrode is a mixed gas of He, $Cl_2$ and $SF_6$, a source radio frequency power is 200 W-1000 W, a biased radio frequency power is 200 W-1000 W, and a pressure is 10-100 mtorr.

9. The fabrication method of the pixel structure according to claim 1, wherein edges of a structure of the etched semiconductor layer are aligned with a lower edge of the source electrode with respect to the drain electrode and a lower edge of the drain electrode with respect to the source electrode, respectively.

10. The fabrication method of the pixel structure according to claim 1, further comprising:
 removing the photoresist pattern covering the source electrode and the drain electrode.

* * * * *